United States Patent
Sung et al.

(10) Patent No.: US 6,346,454 B1
(45) Date of Patent: Feb. 12, 2002

(54) METHOD OF MAKING DUAL DAMASCENE INTERCONNECT STRUCTURE AND METAL ELECTRODE CAPACITOR

(75) Inventors: Chun-Yung Sung; Allen Yen, both of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/383,806

(22) Filed: Aug. 26, 1999

Related U.S. Application Data
(60) Provisional application No. 60/115,703, filed on Jan. 12, 1999.

(51) Int. Cl.⁷ ............................................. H01L 21/331
(52) U.S. Cl. ....................... 438/396; 438/239; 438/523; 438/618
(58) Field of Search .................................. 438/240, 239, 438/396, 399, 404, 523, 618, 622, 637–640

(56) References Cited

U.S. PATENT DOCUMENTS

| | | | |
|---|---|---|---|
| 5,539,231 A | 7/1996 | Suganaga et al. | 257/306 |
| 5,702,981 A | 12/1997 | Maniar et al. | 437/192 |
| 5,801,094 A | 9/1998 | Yew et al. | 438/624 |
| 5,891,799 A | 4/1999 | Tsui | 438/624 |
| 5,933,761 A | 8/1999 | Lee | 438/783 |

FOREIGN PATENT DOCUMENTS

| | | | |
|---|---|---|---|
| CA | 0581475 A1 | * 2/1994 | |
| EP | 0 581 475 | 2/1994 | ......... H01L/21/334 |

OTHER PUBLICATIONS

Patent Absracts of Japan, vol. 013, No. 173 (E–748), Apr. 24, 1989 –& JP 01 004056 A (Hitachi Ltd), Jan. 9, 1989 *abstract; figures 1–6*.
Patent Abstracts of Japan, vol. 017, No. 702 (E–1482), Dec. 21, 1993 –& JP 05 243517 A (Nec Corp), Sep. 21, 1993 *abstract; figure 1*.
Singer, *Semiconductor International*, "Tantalum, Copper and Damascene: The Future of Interconnects", (6/98), pp. 1–8.
Singer, *Semiconductor International*, "Dual–Damascene Challenges Dielectric–Etch", (8–99), pp. 1–5.

* cited by examiner

*Primary Examiner*—Charles Bowers
*Assistant Examiner*—Yennhu B. Huynh
(74) *Attorney, Agent, or Firm*—Allen, Dyer, Doppelt, Milbrath & Gilchrist, P.A.

(57) ABSTRACT

An integrated circuit device and method of making include an interconnect structure and a capacitor. The interconnect structure includes a metal line and a contact, and the capacitor includes upper and lower metal electrodes. The method includes forming a dielectric layer adjacent a semiconductor substrate, and simultaneously forming a first opening for the interconnect structure and a second opening for the capacitor, in the first dielectric layer. The method further includes selectively depositing a first conductive layer to fill the first opening to form the interconnect structure, and forming the upper and lower metal electrodes with a capacitor dielectric therebetween to form the capacitor in the second opening. The integrated circuit device provides a high-density capacitor having metal electrodes and which is compatible and integrated with dual damascene structures. As such, the capacitor is situated in a same level as a dual damascene interconnect structure.

18 Claims, 5 Drawing Sheets

METHOD OF MAKING DUAL DAMASCENE INTERCONNECT STRUCTURE AND METAL ELECTRODE CAPACITOR

RELATED APPLICATION

This application is based upon prior filed copending provisional application Ser. No. 60/115,703 filed Jan. 12, 1999.

FIELD OF THE INVENTION

The present invention relates to the field of integrated circuits, and, more particularly, to integrated circuit devices having capacitors.

BACKGROUND OF THE INVENTION

Capacitors are used in semiconductor devices such as integrated circuits (ICs) for storing electrical charge. In ICs such as a dynamic random access memory (DRAM), capacitors are used for storage in the memory cells. Typically, capacitors formed in ICs include a lower electrode made of, e.g., polycrystalline silicon (polysilicon), a dielectric layer made of, e.g., tantalum pentoxide and/or barium strontium titantate, and an upper electrode made of, e.g., titanium nitride, titanium, tungsten, platinum or polysilicon.

In recent years, the development of the semiconductor memory device has required higher packing density, and the area occupied by a capacitor of a DRAM storage cell shrinks, thus decreasing the capacitance of the capacitor because of its smaller electrode surface area. However, a relatively large capacitance is required to achieve a high signal-to-noise ratio in reading the memory cell. Therefore, it is desirable to reduce the cell dimension and yet obtain a high capacitance. This can be accomplished with a metal electrode capacitor, for example, which also may include a high-k dielectric.

Traditionally, interconnection between two conductors in a semiconductor device has been provided by a plug structure such as a tungsten plug, for example, for an electrical connection between first and second metal lines. Such structures require three separate processing steps including one for the formation of each of the two conductors and one for the formation of the tungsten plug structure.

Additionally, greater interest has been shown by manufacturers of semiconductor devices in the use of copper and copper alloys for metallization patterns, such as in conductive vias and interconnects. Copper, compared to aluminum, has both good electromigration resistance and a relatively low electrical resistivity of about 1.7 $\mu$ohm cm. Unfortunately, copper is difficult to etch. Consequently, dual damascene processes have been developed to simplify the process steps and eliminate a metal etch step to form copper interconnects. Dual damascene processes are also used with aluminum interconnects.

A dual damascene structure has a bottom portion or via that contacts an underlying conductor and replaces the function of a plug structure in a traditional interconnect structure. The dual damascene structure also has a top portion or inlaid trench that is used for the formation of a second conductor. Because the bottom and top portions of a dual damascene structure are in contact with each other, they can be filled simultaneously with the same conductive material, e.g. copper. This eliminates the need to form a plug structure and an overlying conductive layer in separate processing steps.

In the dual damascene process, capacitors are usually formed in a separate level by depositing a first conductive layer, forming the dielectric therebetween, forming a second conductive layer, and then patterning and etching the layered structure. The conductive layers are typically formed of poly-silicon or titanium nitride, for example. Next an oxide is formed over the capacitors and results in surface topographies above the capacitors. This requires chemical mechanical polishing (CMP) to planarize the oxide layer before subsequent layers are formed.

Thus, the conventional process of making capacitors requires additional time due to the etching of the conductive layers as well as the CMP step. Also, if forming a capacitor with metal electrodes, i.e. a metal-insulator-metal (MIM) capacitor, the metal etch step required is not fully compatible with the dual damascene process. In other words, as discussed above, the dual damascene process is used specifically to avoid metal etching; therefore, using a metal etch step within a dual damascene process is undesirable.

As can be seen from the above discussion, there is a need for integration of a high-density metal electrode capacitor which is compatible with the dual damascene process.

SUMMARY OF THE INVENTION

In view of the foregoing background, it is therefore an object of the invention to provide a method of making an integrated circuit device with the dual damascene process and including a high-density capacitor having metal electrodes.

It is another object of the invention to provide an integrated circuit device including a high-density capacitor having metal electrodes and which is compatible with dual damascene interconnect structures.

These and other objects, features and advantages in accordance with the present invention are provided by a method of making an integrated circuit device including an interconnect structure and a capacitor, the interconnect structure comprising a metal line and a contact, and the capacitor comprising upper and lower metal electrodes. The method includes forming a dielectric layer adjacent a semiconductor substrate, and simultaneously forming a first opening for the interconnect structure and a second opening for the capacitor, in the first dielectric layer. The method further includes selectively depositing a first conductive layer to fill the first opening to form the interconnect structure, and forming the upper and lower metal electrodes with a capacitor dielectric therebetween to form the capacitor in the second opening. The first conductive layer may be formed by electroplating copper while masking the second opening, and may also include a barrier metal layer to at least line the first opening. The barrier metal layer preferably comprises tantalum nitride.

Also, the step of simultaneously forming the first opening and the second opening may comprise: simultaneously forming an upper portion of the first opening and an upper portion of the second opening; and simultaneously forming a lower portion of the first opening and a lower portion of the second opening. Additionally, the upper portion of the first opening may have a greater width than the lower portion of the first opening, and the upper portion of the second opening may have substantially a same width as the lower portion of the second opening.

The dielectric layer may be formed of a lower dielectric layer portion, an etch stop layer and an upper dielectric layer portion. Thus, the upper portion of the first opening and the upper portion of the second opening may be formed simultaneously in the upper dielectric layer portion and the etch stop layer. Also, the lower portion of the first opening and the lower portion of the second opening may be formed simultaneously in the lower dielectric layer portion.

The capacitor may be formed by depositing a lower metal layer to at least line the second opening and to form the lower metal electrode, forming the capacitor dielectric layer on the lower metal layer, depositing an upper metal layer on the capacitor dielectric layer to form the upper metal electrode. Also, a second conductive layer may be selectively deposited to fill a remaining portion of the second opening. This second conductive layer preferably comprises copper, and the upper and lower metal electrodes of the capacitor preferably comprise tantalum nitride. The capacitor dielectric may be a high-k dielectric having, e.g., a dielectric constant greater than about 25.

The advantages in accordance with the present invention are also provided by an integrated circuit device including a dielectric layer adjacent a semiconductor substrate having first and second openings therein, an interconnect structure in the first opening and comprising a metal line and a metal contact depending therefrom, and a capacitor in the second opening and comprising upper and lower metal electrodes with a capacitor dielectric layer therebetween. The capacitor may have a substantially planar upper surface substantially flush with adjacent upper surface portions of the dielectric layer. Also, the edges of the lower electrode and the capacitor dielectric layer may terminate at the upper surface of the capacitor.

Again, with respect to the method as set forth above, the dielectric layer may comprise a lower dielectric layer portion, an etch stop layer, and an upper dielectric layer portion. Thus, the metal line of the interconnect structure is preferably in the upper dielectric layer portion and the etch stop layer of the dielectric layer, and the contact of the interconnect structure is preferably in the lower dielectric layer portion of the dielectric layer. Also, the capacitor is preferably in the upper dielectric layer portion, the etch stop layer, and the lower dielectric layer portion of the dielectric layer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for clarity.

Figure 1:
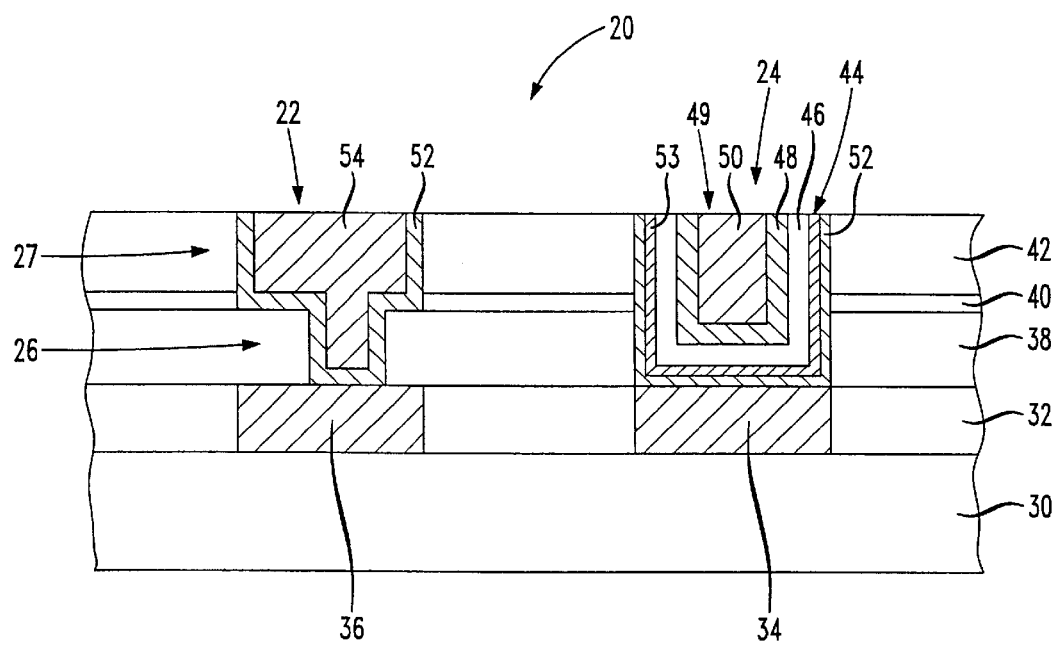
FIG. 1 is a cross-sectional view of an integrated circuit device including an interconnect structure and metal electrode capacitor in accordance with the present invention.

Referring to FIG. 1, an integrated circuit device 20 including an interconnect structure 22 and metal electrode capacitor 24 formed on a semiconductor substrate 30 in accordance with the present invention, will now be described. The semiconductor substrate 30 is preferably silicon, or may be silicon or a polysilicon layer or structure formed on the substrate. A plurality of devices, such as transistors (not shown), are formed in the substrate 30 using well known techniques. The integrated circuit device 20 includes a first dielectric layer 32 adjacent the substrate 30. The first dielectric layer is formed from any suitable dielectric, e.g., silicon dioxide, silicon nitride and/or any material or alloy of material having a desired dielectric constant. Other suitable materials include tantalum pentoxide and barium strontium titantate, for example, as long as the dielectric does not affect the formation of the interconnect structure and capacitor of the present invention.

This first dielectric layer 32 is shown in FIG. 1 with interconnects 34 and 36. The first dielectric layer 32 and the interconnects 34 and 36 illustrate an example of an underlying level of the integrated circuit device. The skilled artisan would appreciate that a plurality of interconnect levels and vias will be present throughout the device and at multiple levels within the device. A via is an opening formed in an interlevel dielectric layer to expose a certain portion of an underlying metal line to allow electrical contact to be made to the line. A conductive contact is then formed in the via to connect the underlying metal line with a subsequently formed overlying metal line.

The integrated circuit device 20 further includes a second dielectric layer 38 and a third dielectric layer 42. The second and third dielectric layers 38 and 42 are preferably separated by an etch stop layer 40. Again, the second and third dielectric layers 38 and 42 are formed from any suitable dielectric having a desired dielectric constant, as would readily be appreciated by the skilled artisan. The etch stop layer 40 is typically formed from silicon nitride and deposited by conventional techniques.

The interconnect structure 22 includes a metal line 27 and a contact 26. The metal line 27 is formed in the third dielectric layer 42 and the etch stop layer 40. The contact is formed in the second dielectric layer 38. The interconnect structure 22 comprises a barrier metal layer 52 and a metal conductive layer 54. The barrier metal layer may be formed of any suitable metal layer, e.g., tantalum nitride, titanium nitride or tungsten nitride, which will substantially prohibit diffusion of the metal from the metal conductive layer 54 into the dielectric layers 38 and 42. The conductive metal layer 54 is preferably copper but may include aluminum or tungsten, for example. Especially for a copper metal layer 54, a copper seed layer (not shown) is also typically formed on the barrier metal layer 52, as will be readily appreciated by those skilled in the art.

The capacitor 24 includes a lower electrode 44, a dielectric 46, and an upper electrode 49. The lower electrode 44 is formed of at least one layer of a conductive metal such as tantalum nitride, for example. The lower electrode 44 illustratively includes two metal layers 52, 53, such as formed of tantalum nitride. A copper seed layer, not shown, may also be formed between the two tantalum nitride layers 52, 53 when copper is used as the interconnection metal as will be understood by those skilled in the art.

The capacitor dielectric 46 is formed of a suitable dielectric material, e.g. silicon oxide, silicon nitride or tantalum oxide, having a desired dielectric constant. Preferably, the capacitor dielectric 46 has a dielectric constant greater than about 25 to achieve desired capacitor characteristics.

The upper electrode 49 illustratively comprises conductive metal layer 48 and conductive metal layer 50. The conductive metal layer 48 may be formed of tantalum nitride, for example, and the conductive metal layer 50 may be formed of copper. Of course, a copper seed layer, not shown, may be between the two layers 48,50. The conductive metal layer 48 may also act as a barrier layer to prohibit diffusion of the metal, e.g. copper, from the metal conductive layer 50 into the dielectric 46. The capacitor 24 has a substantially planar upper surface substantially flush with adjacent upper surface portions of the third dielectric layer 42. Also, edges of the lower metal 44 electrode and the capacitor dielectric 46 terminate at the upper surface of the capacitor 24.

As described, the integrated circuit device 20 of the present invention provides a high-density capacitor 24 having metal electrodes 44,49 and which is compatible and integrated with dual damascene structures. As such, the capacitor 24 is situated in a same level as the dual damascene interconnect structure 22.

Figure 2:
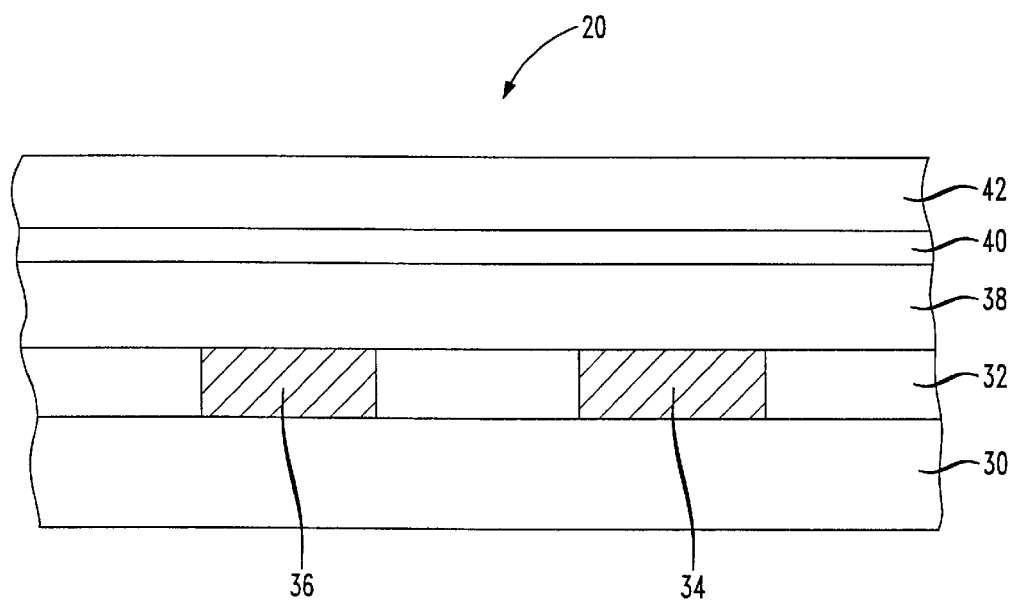
FIGS. 2–8 are cross-sectional views of an integrated circuit device to illustrate a dual damascene process for forming an interconnect structure and metal electrode capacitor in accordance with the present invention.

Referring now to FIGS. 2–8, a dual damascene process for making the integrated circuit device 20 including an interconnect structure 22 and metal electrode capacitor 24 formed on a semiconductor substrate 30 in accordance with the present invention, will now be described. As shown in FIG. 2, a semiconductor substrate 30 is provided, and a first dielectric layer 32 is formed adjacent the semiconductor substrate by conventional techniques. As mentioned above, the semiconductor substrate 30 is preferably silicon.

A plurality of devices, such as transistors (not shown), are formed in the substrate 30 using well known techniques. The semiconductor substrate 30 and other associated layers form a semiconductor wafer as known to those skilled in the art. The first dielectric layer 32 can be formed of silicon dioxide as well as other known dielectrics. Of course, the first dielectric layer 32 may be deposited or grown. Further, the first dielectric layer 32 includes interconnects 34 and 36. The interconnects 34 and 36 are formed by depositing a conductive metal, e.g. aluminum and/or copper, in trenches which have been etched in the first dielectric layer 32. The first dielectric layer 32 and the interconnects 34 and 36 illustrate an example of an underlying level of the integrated circuit device.

A second dielectric layer 38 is formed adjacent the first dielectric layer 32 and the interconnects 34 and 36. An etch stop layer 40 is formed over the second oxide layer 38 as illustrated. Next, a third dielectric layer 42 is formed adjacent the etch stop layer 40. Again, the second and third dielectric layers 38 and 42 are formed from any suitable dielectric having a desired dielectric constant, and are deposited or grown as would readily be appreciated by the skilled artisan. The etch stop layer 40 is typically formed from silicon nitride and deposited by conventional techniques. This non-conductive silicon nitride etch stop layer 40 is typically deposited on the associated dielectric layer, e.g. the second dielectric layer 38, using CVD at temperatures between about 600° C. and 900° C.

Figure 3:
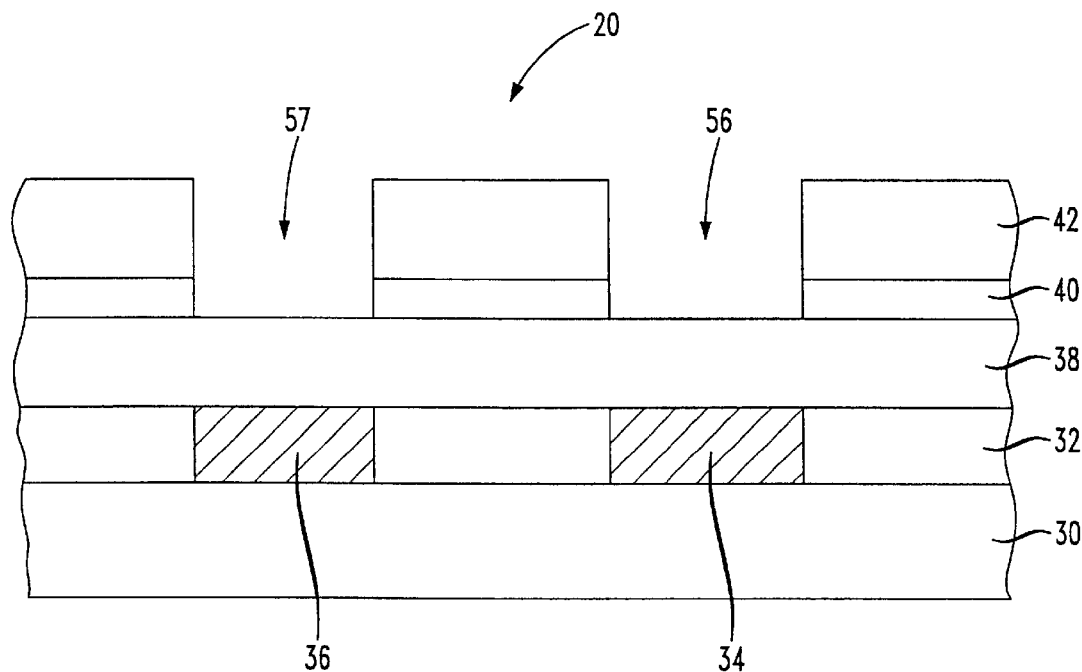

As shown in FIG. 3, a first set of openings 56 and 57 are selectively formed through the third dielectric layer 42 and also through the etch stop layer 40. Although the present description proceeds with the etching of the third dielectric layer 42 followed by the etching of the etch stop layer 40, other etching steps for etching the third dielectric layer and the etch stop layer can be used as would readily be appreciated by those skilled in the art. The openings, e.g., trenches 56 and 57, will later be used to form a metallization conductor or a capacitor as will be explained below.

Figure 4:
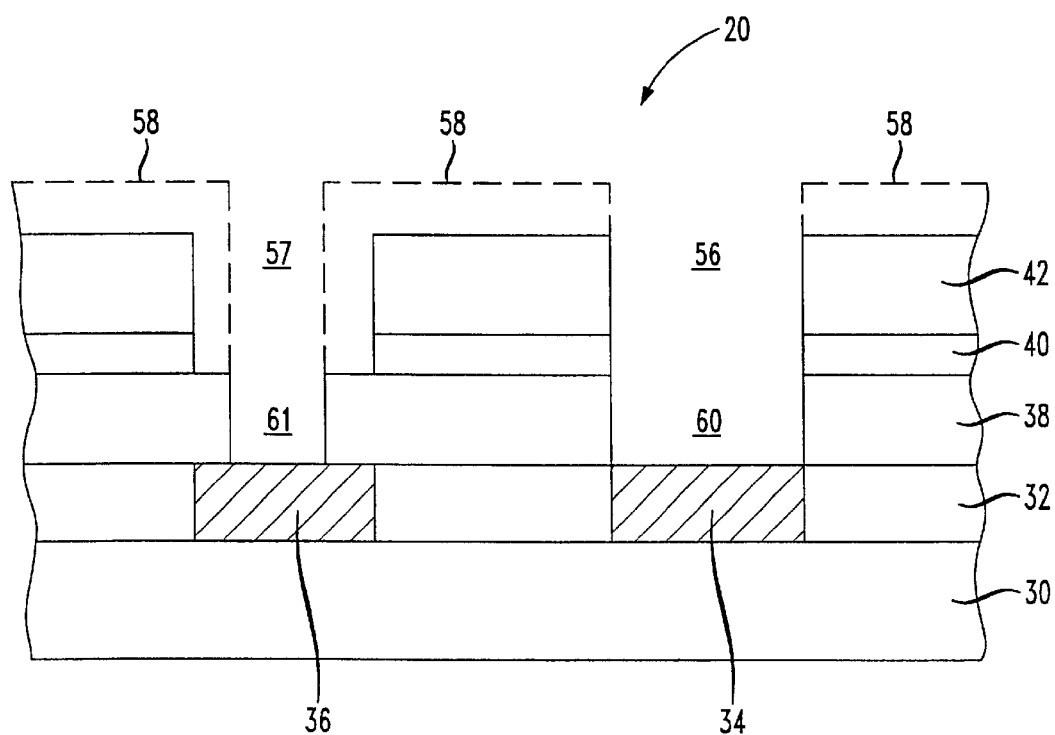

As is known in the damascene process as shown in FIG. 4, at least a second set of selected openings 60 and 61 are etched in the second dielectric layer 38 within the bounds defined by each of the first set of openings 56 and 57. A photo resist shown by the dashed lines at 58 is applied to form the second set of openings 60 and 61. The photo resist is then removed by techniques known to those skilled in the art. As illustrated, the opening 62 is for forming a via between different layers, as is well known to those skilled in the art. However, although the opening 60 has been illustrated, as an example, as being substantially the same width as the above opening 56 in the third dielectric layer 42, this opening 60 may also be more narrow than the above opening 56 as is the case with openings 61 and 57.

Figure 5:
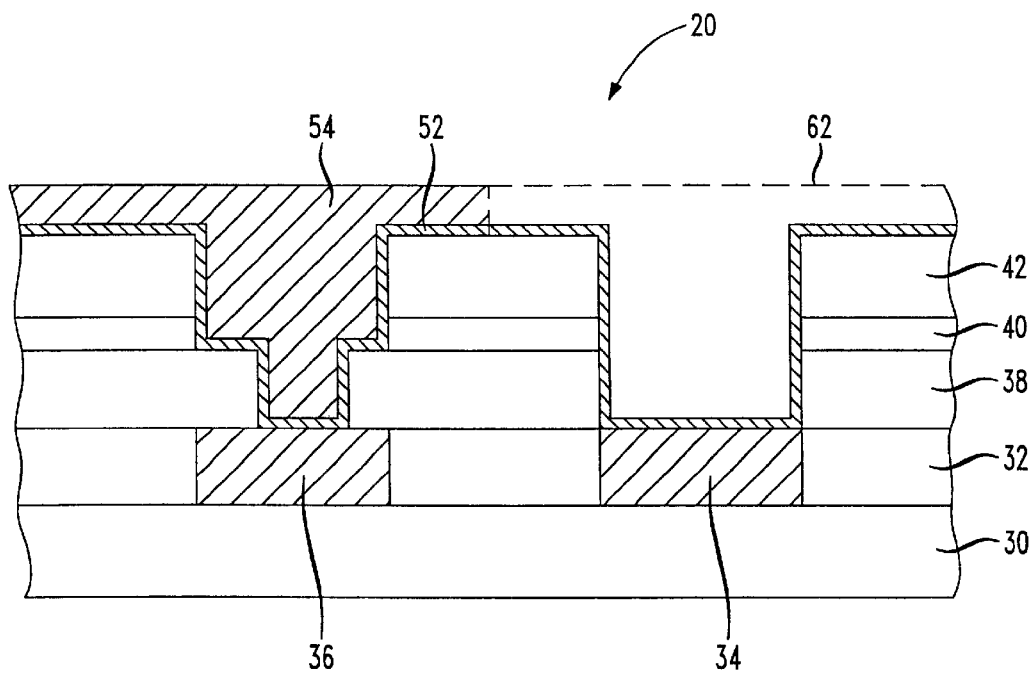

As shown in FIG. 5, a photo resist 62 is formed over the openings 56 and 60. A barrier metal layer 52 is preferably formed to line openings 56, 57, 60 and 61 before the photo resist 62 is formed. A conductive metal layer 54, e.g. aluminum and/or copper, is selectively deposited over the third dielectric layer 42, such that the conductive metal layer 54 is deposited within the openings 57 and 61 and over at least portions of the third dielectric layer 42 adjacent the opening 57. The conductive metal layer 54 can be deposited by electrodeposition, electroplating or chemical vapor deposition techniques well known to those skilled in the art. Of course if copper is used as the conductive metal layer 54, a copper seed layer (not shown) may be formed on the barrier metal layer 52. The photo resist 62 is then removed and the openings 56 and 60 are cleaned by techniques known to those skilled in the art.

Figure 6:
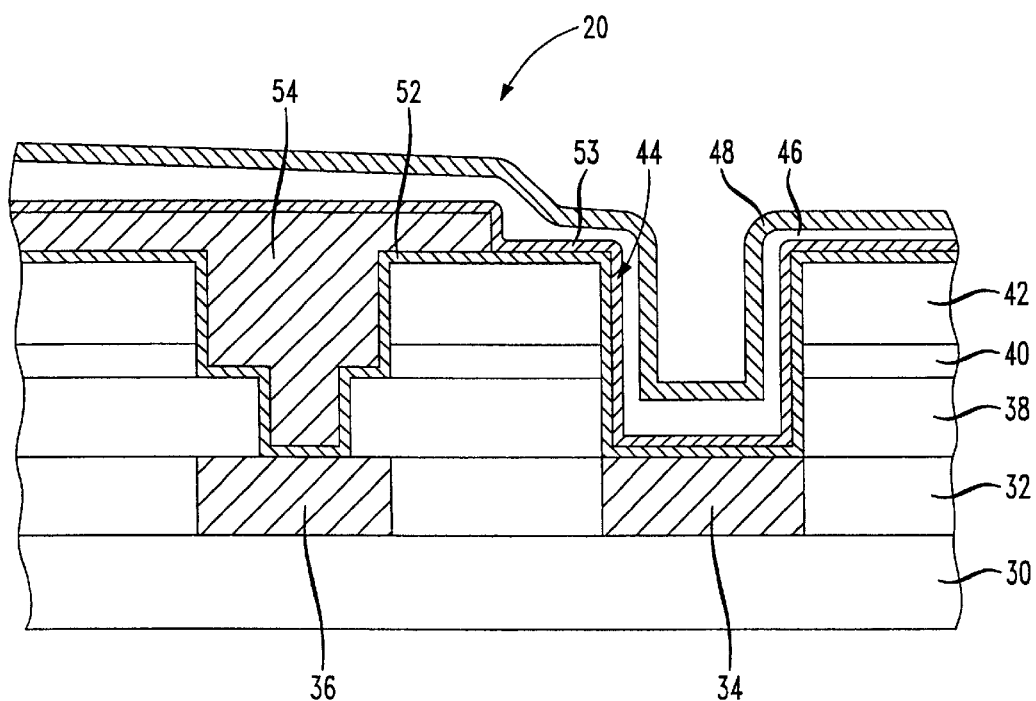

Referring to FIG. 6, a barrier metal layer 53, such as tantalum nitride, titanium nitride or tungsten nitride, for example, is then deposited to complete the lower electrode 44. Next, the capacitor dielectric 46 is formed by deposition or epitaxial growth. The capacitor dielectric 46 is formed of a suitable dielectric material, e.g. silicon oxide, silicon nitride or tantalum oxide, having a desired dielectric constant. Preferably, the capacitor dielectric 46 has a dielectric constant greater than about 25 to achieve the desired capacitor characteristics. Then, a barrier metal layer 48 such as tantalum nitride, titanium nitride or tungsten nitride, for example, is then deposited to form part of the upper electrode 49. As illustrated, the materials forming the electrodes 44 and 49 as well as the dielectric 46, have been blanket deposited over the upper surface of the integrated circuit device 20.

Figure 7:
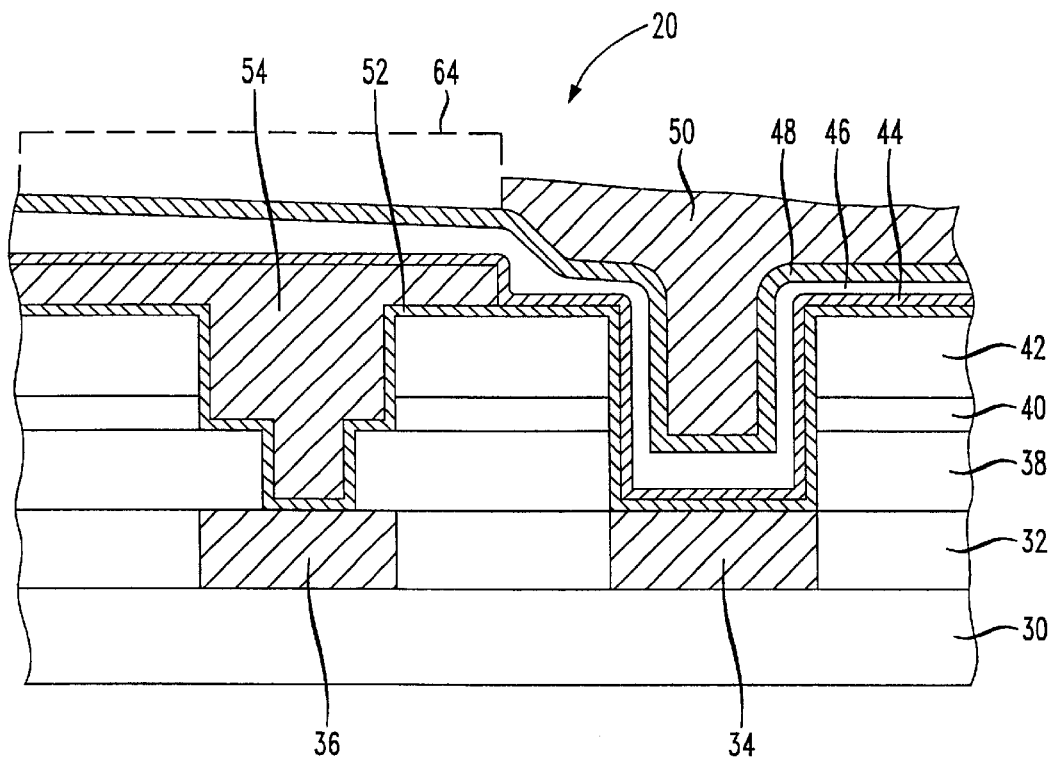

Referring to FIG. 7, a conductive metal layer 50, e.g. aluminum and/or copper, is deposited to form part the upper electrode 49, such that the conductive metal layer 50 is deposited within a remaining portion of the openings 56 and 60. This deposition step may involve selective deposition including a photo resist 64 formed over the interconnect structure 22, as illustrated. However, the conductive metal layer 50 may also be blanket deposited over the entire upper surface of the integrated circuit device 20. The conductive metal layer 50 can be deposited by electrodeposition, electroplating or chemical vapor deposition techniques well known to those skilled in the art. Of course if copper is used as the conductive metal layer 50, a copper seed layer (not shown) may be formed on the upper electrode 48.

Figure 8:
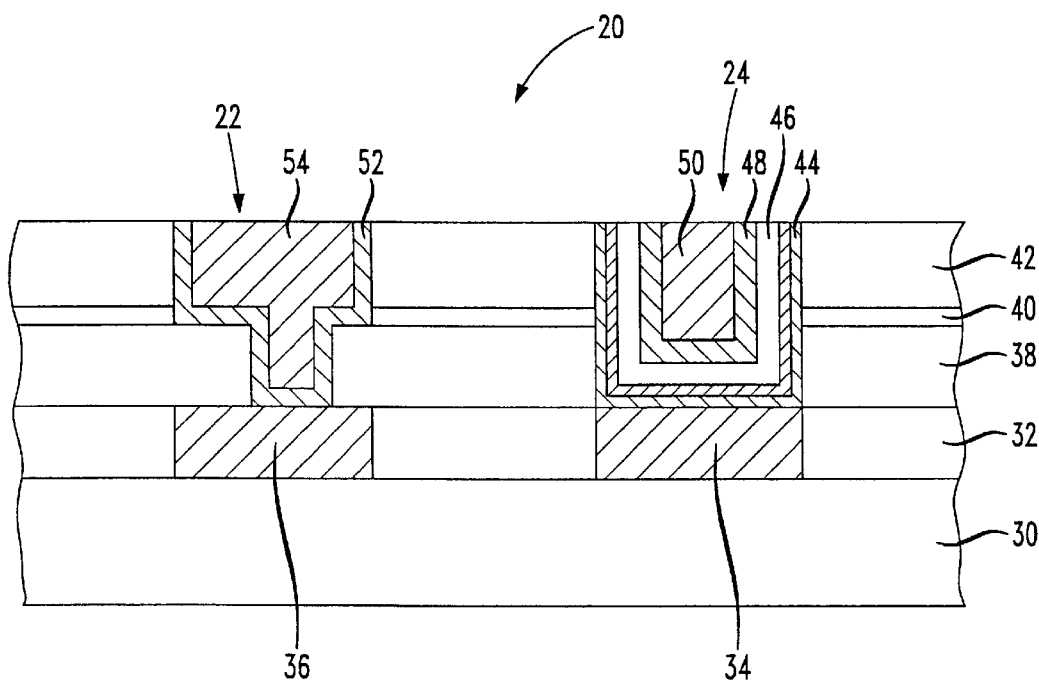

An upper surface of the integrated circuit device is then planarized using CMP, for example, as shown in FIG. 8. Thus the capacitor 24 has a substantially planar upper surface substantially flush with adjacent upper surface portions of the third dielectric layer 42. Also, edges of the lower metal 44 electrode and the capacitor dielectric 46 terminate at the upper surface of the capacitor 24. Accordingly, a dual damascene process is provided for making the integrated circuit device 20 of the present invention with a high-density capacitor 24 having metal electrodes 44, 49, and which is compatible and integrated with dual damascene structures such as the interconnect structure 22. The process of the present invention does not require etching metal layers or CMP of oxides to form a capacitor having metal electrodes.

Figure 9:
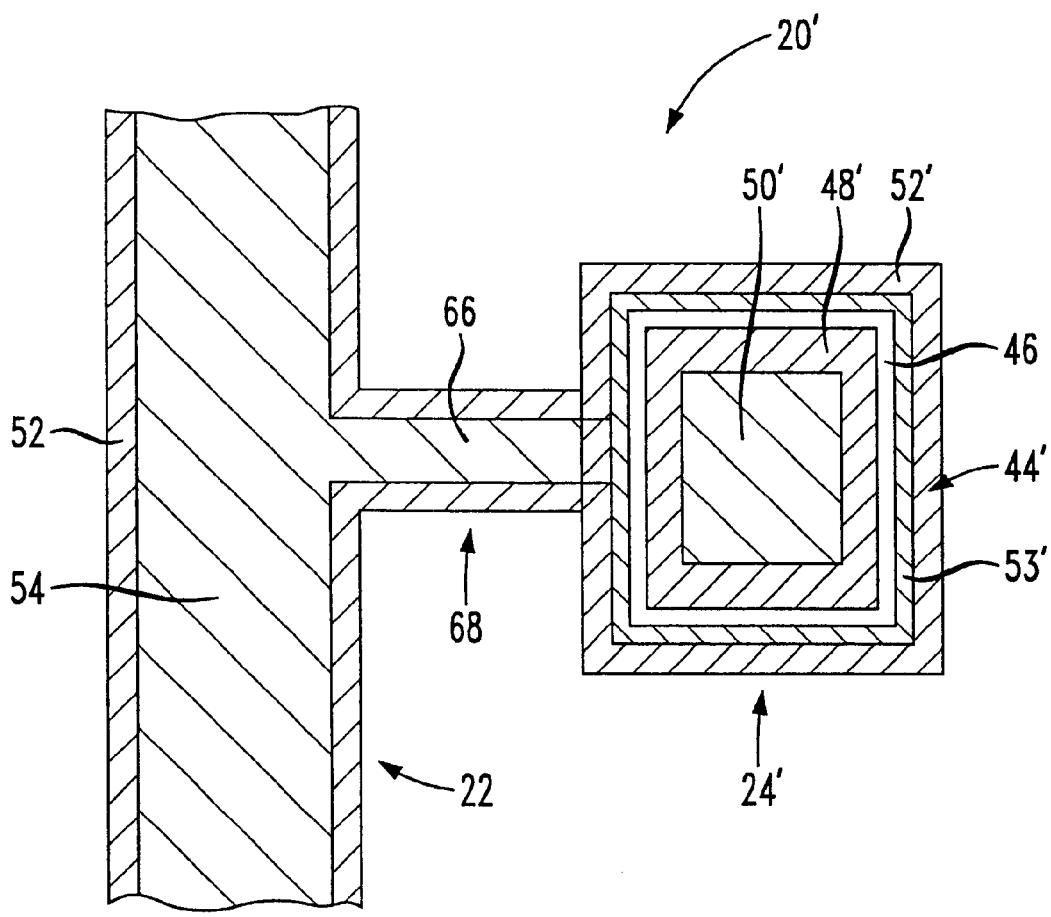
FIG. 9 is a lateral cross-sectional view through an upper portion of another embodiment of an integrated circuit device in accordance with the present invention.

Additionally, referring to FIG. 9 another embodiment the integrated circuit device 20' of the present invention is described. Because the lower electrode 44' surrounds the capacitor 24', a contact 66 may be formed in a side trench 68 to connect the capacitor 24' to an associated metal line such as the conductive layer 54. In this embodiment, an interconnect 34 (FIG. 1) would not be necessary to contact the lower electrode 44'. This may also eliminate a layer and allow reduction of the dimensions of the integrated circuit 20'. Furthermore, the trench 68 may be formed during the dielectric etch which forms the openings 56 and 57. This would also reduce the number of steps required in making the integrated circuit device 20'.

The thicknesses of the various layers may vary as would be appreciated by those skilled in the art. For example, the first dielectric layer 32 can be deposited over the substrate by chemical vapor deposition (CVD) from a TEOS source gas and could have a thickness of about 400 to 600 nanometers or greater. The second and third dielectric layers 38 and 42 can also be formed in a similar thickness range. The appropriate silicon nitride etch stop layer 40 can have a thickness between about 200 to 1,500 angstroms, for example. Naturally, this is only a range of thickness, which can vary depending on the thickness desired and the end use of the semiconductor devices.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making an integrated circuit device including an interconnect structure and a capacitor, the interconnect structure comprising a metal line and a metal contact, and the capacitor comprising upper and lower metal, electrodes, the method comprising the steps of:

forming a dielectric layer adjacent a semiconductor substrate;

simultaneously forming a first opening for the interconnect structure and a second opening for the capacitor, in the dielectric layer;

forming a mask over the second opening;

selectively depositing a first metal conductive layer to fill the first opening;

removing the mask from the second opening;

depositing a lower metal layer to at least line the second opening and to form the lower metal electrode of the capacitor;

forming a capacitor dielectric layer on the lower metal layer to form the capacitor dielectric of the capacitor;

depositing an upper metal layer on the capacitor dielectric layer to form part of the upper metal electrode of the capacitor;

depositing a second conductive layer to fill a remaining portion of the second opening and form part of the upper metal electrode of the capacitor; and planarizing an upper surface of the integrated circuit device.

2. A method according to claim 1, wherein the step of simultaneously forming the first opening and the second opening comprises:

simultaneously forming an upper portion of the first opening and an upper portion of the second opening; and simultaneously forming a lower portion of the first opening and a lower portion of the second opening;

the upper portion of the first opening having a greater width than the lower portion of the first opening, and the upper portion of the second opening having substantially a same width as the lower portion of the second opening.

3. A method according to claim 1, wherein the step of forming the dielectric layer comprises:

forming a lower dielectric layer portion adjacent the semiconductor substrate;

forming an etch stop layer on the lower dielectric layer portion; and forming an upper dielectric layer portion on the etch stop layer.

4. A method according to claim 3, wherein the step of simultaneously forming the first opening and the second opening comprises:

simultaneously forming an upper portion of the first opening and an upper portion of the second opening in the upper dielectric layer portion and the etch stop layer; and simultaneously forming a lower portion of the first opening and a lower portion of the second opening in the lower dielectric layer portion;

the upper portion of the first opening having a greater width than the lower portion of the first opening, and the upper portion of the second opening having a substantially same width as the lower portion of the second opening.

5. A method according to claim 1, wherein the step of selectively depositing the conductive layer in the first opening comprises electro-depositing copper.

6. A method according to claim 1, wherein the step of selectively depositing the conductive layer in the first opening comprises:

depositing a barrier metal layer to at least line the first opening; and electro-depositing copper to fill the lined first opening.

7. A method according to claim 6, wherein the barrier metal layer comprises tantalum nitride.

8. A method according to claim 1, wherein the lower and upper metal electrodes comprise tantalum nitride.

9. A method according to claim 1, wherein the capacitor dielectric layer has a dielectric constant greater than about 25.

10. A method according to claim 1, wherein the second conductive layer comprises copper.

11. A method according to claim 1, further comprising the step of forming a capacitor contact in the dielectric layer and electrically connecting the metal line of the interconnect structure and the lower metal electrode of the capacitor.

12. A method of making an integrated circuit device including an interconnect structure and a capacitor, the interconnect structure comprising a metal line and a contact, and the capacitor comprising upper and lower metal electrodes, the method comprising:

forming a dielectric layer adjacent a semiconductor substrate;

simultaneously forming a first opening for the interconnect structure and a second opening for the capacitor, in the dielectric layer;

selectively depositing a first conductive layer comprising copper to fill the first opening to form the interconnect structure while masking the second opening; and forming the upper and lower metal electrodes with a capacitor dielectric therebetween to form the capacitor in the second opening.

13. A method according to claim 12, wherein selectively depositing the first conductive layer in the first opening comprises depositing a barrier metal layer to at least line the first opening; and wherein the copper is electro-deposited copper to fill the lined first opening.

14. A method according to claim 13, wherein the barrier metal layer comprises tantalum nitride.

15. A method according to claim 12, wherein forming the capacitor in the second opening comprises:

depositing a lower metal layer to at least line the second opening and to form the lower metal electrode;

forming the capacitor dielectric layer on the lower metal layer;

depositing an upper metal layer on the capacitor dielectric layer to form the upper metal electrode;

depositing a second conductive layer to fill a remaining portion of the second opening.

16. A method according to claim 15, wherein the second conductive layer comprises copper.

17. A method according to claim 12, wherein the upper and lower metal electrodes of the capacitor comprise tantalum nitride.

18. A method according to claim 12, wherein the capacitor dielectric has a dielectric constant greater than about 25.

* * * * *